US009638757B2

(12) United States Patent
Feuchter et al.

(10) Patent No.: US 9,638,757 B2
(45) Date of Patent: May 2, 2017

(54) METHOD AND ARRANGEMENT FOR MONITORING THE VOLTAGE ON ELECTRICAL STORAGE UNITS, BATTERY AND MOTOR VEHICLE HAVING SUCH A BATTERY

(71) Applicants: Robert Bosch GmbH, Stuttgart (DE); Samsung SDI Co., Ltd., Yongin-si, Gyeonggi-do (KR)

(72) Inventors: Wilfried Feuchter, Kupferzell (DE); Andreas Heyl, Ludwigsburg (DE); Jochen Weber, Asperg (DE); Berengar Krieg, Gerlingen (DE); Sandeep Bisht, Reutlingen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 915 days.

(21) Appl. No.: 13/906,496

(22) Filed: May 31, 2013

(65) Prior Publication Data
US 2013/0320988 A1    Dec. 5, 2013

(30) Foreign Application Priority Data

Jun. 1, 2012 (DE) .................. 10 2012 209 308

(51) Int. Cl.
*H01M 10/44* (2006.01)
*H01M 10/46* (2006.01)
*G01R 31/36* (2006.01)

(52) U.S. Cl.
CPC ....... *G01R 31/3606* (2013.01); *G01R 31/362* (2013.01); *G01R 31/3648* (2013.01); *G01R 31/3658* (2013.01)

(58) Field of Classification Search
CPC . H02J 7/04; H02J 7/045; H02J 7/1469; G01R 19/16542; G01R 31/3658
USPC ......... 320/152, 157, 162; 324/426, 427, 433
See application file for complete search history.

(56) References Cited

U.S. PATENT DOCUMENTS

| 6,121,750 | A * | 9/2000 | Hwa | .................. H01M 10/0445 307/10.1 |
| 2009/0034159 | A1* | 2/2009 | Froeschl | ............... H02J 7/0022 361/502 |
| 2009/0091299 | A1* | 4/2009 | Lin | ..................... H01M 10/441 320/137 |
| 2012/0133203 | A1* | 5/2012 | Lienkamp | ................ B60L 7/14 307/9.1 |

FOREIGN PATENT DOCUMENTS

DE    10 2010 041 492 A1    3/2012

* cited by examiner

*Primary Examiner* — Edward Tso
(74) *Attorney, Agent, or Firm* — Maginot, Moore & Beck LLP

(57) ABSTRACT

The present disclosure relates to a method for monitoring the voltage on electrical storage units, to a battery and to a motor vehicle having such a battery that are configured to be used particularly for improved establishment of overvoltages and/or undervoltages on modules of the electrical storage unit. To this end, a method for monitoring the voltage on at least one electrical storage unit includes extracting an idle voltage U_OCV on the at least one electrical storage unit from a voltage U_measured that is measured on the at least one electrical storage unit.

9 Claims, 1 Drawing Sheet

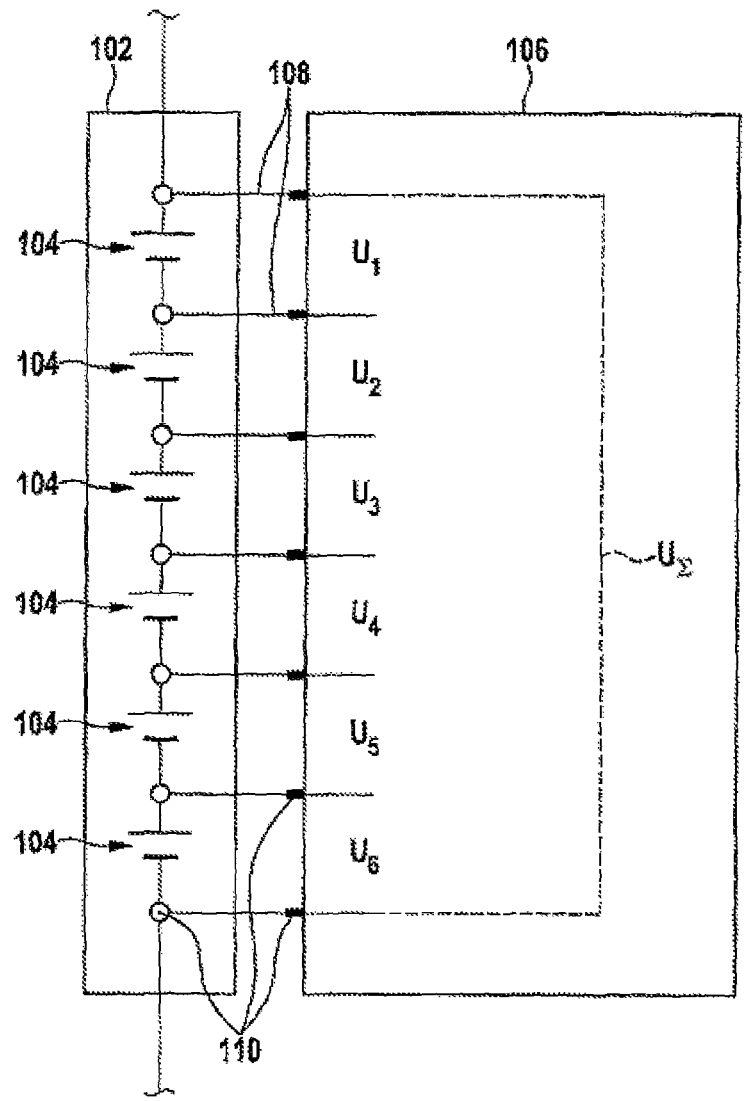

METHOD AND ARRANGEMENT FOR MONITORING THE VOLTAGE ON ELECTRICAL STORAGE UNITS, BATTERY AND MOTOR VEHICLE HAVING SUCH A BATTERY

This application claims priority under 35 U.S.C. §119 to patent application no. DE 10 2012 209 308.7, filed on Jun. 1, 2012 in Germany, the disclosure of which is incorporated herein by reference in its entirety.

BACKGROUND

The present disclosure relates to a method and an arrangement for monitoring the voltage on electrical storage units, to a battery and to a motor vehicle having such a battery that are able to be used particularly for improved establishment of overvoltages and/or undervoltages on modules of the electrical storage unit.

For the supply of power to electric drives in electric and hybrid vehicles, high-voltage lithium ion batteries are frequently used. The chemistry of these batteries means that they have a hazard potential—if operating limits are exceeded, there may be a battery fire or leakage of dangerous chemical substances.

It is a task of the battery management system (BMS) to regulate the charging and discharge of the battery under the given requirements such that safety is ensured. To this end, appropriate algorithms and application parameters are stored in the BMS.

Possible hazard triggers in the case of lithium ion cells are overvoltage (e.g. voltages above 4.2 V) and undervoltage (e.g. 2.5 V) or recharging following an undervoltage. The voltage limits are accordingly monitored by the BMS and the transition to the safe state is initiated in the event of overvoltage or undervoltage.

Both safety (an overvoltage or undervoltage must be identified) and availability (an overvoltage or undervoltage should not be identified erroneously) require the most precise possible measurement of the voltage.

However, the measured voltage when measuring cell voltage comprises two contributing elements: 1) the source or idle voltage on the cell: $U\_OCV$ and 2) the current-dependent voltage on the nonreactive resistances inside and outside the cell (e.g. as a result of contact points): $U\_ohm$.

The following relationship is obtained for the measured voltage $U\_measured$:

$$U\_measured = U\_OCV - U\_ohm.$$

In respect of safety or cell loading, only the idle voltage $U\_OCV$ on the cell is relevant. Therefore, the nonreactive influences can result in 1) an overvoltage not being identified or 2) an undervoltage being identified erroneously.

In ordinary battery controllers, the monitoring of the voltage is implemented by hardware elements, e.g. by comparators, which perform this function either independently or as support or a fallback level for the software monitoring. In this case, this hardware monitoring is usually limited to just one input parameter—the voltage itself—on account of the circuit complexity. The current as a further parameter, as a cause of the voltage drop, therefore cannot be taken into account additionally.

Moreover, the nonreactive resistance varies over the lifespan on account of cell ageing, corrosion or deteriorating contact-connection on measuring lines and at contact points. These effects cannot be quantified by the conventional monitoring.

The prior art, for example DE 102010041492 A1, also discloses the practice of monitoring traction batteries by dispensing with the "hardware path" for monitoring safety-related variables and by monitoring measure variables such as voltage or temperature using a microcontroller on which safety functions are implemented by software. To ensure the redundancy of the monitoring, this solution involves the communication link between the battery and the microcontroller being monitored and checked for plausibility.

SUMMARY

One particular advantage of the disclosure is that cell capacitances can be utilized better. This is achieved by virtue of the method according to the disclosure for monitoring the voltage on at least one electrical storage unit involving the idle voltage $U\_OCV$ on the at least one electrical storage unit being extracted from a voltage $U\_measured$ that is measured on the at least one electrical storage unit. By way of example, the at least one electrical storage unit may be a battery, preferably a traction battery in an electric or hybrid vehicle. In one preferred embodiment, the electrical storage unit comprises at least one electrochemical cell, but preferably a multiplicity of electrochemical cells. In this case, a plurality of, that is to say at least two, electrochemical cells may in turn be combined to form an electrochemical module. Since the measured voltage $U\_measured$ comprises not only the idle voltage $U\_OCV$ but also a further voltage portion, namely a current-dependent voltage portion $U\_ohm$, which is not relevant to the safety of the at least one electrical storage unit or to the cell loading, the monitoring of the voltage can be specified in that the idle voltage $U\_OCV$ is extracted, in particular calculated, from the measured voltage $U\_measured$. In one preferred embodiment, the idle voltage $U\_OCV$ is extracted by eliminating a current-dependent portion $U\_ohm$ of the measured voltage $U\_measured$.

In one preferred embodiment, the monitoring of the voltage comprises monitoring of an overvoltage and/or undervoltage. For this, at least one upper and one lower voltage threshold are prescribed which, when exceeded or undershot, prompt the at least one electrical storage unit to be transferred to a safe state. In particular, the voltage thresholds are monitored by a BMS. By extracting the idle voltage $U\_OCV$ from the measured voltage $U\_measured$, it is possible to prescribe these voltage thresholds more precisely, with the result that an overvoltage can be safely identified and an erroneously identified undervoltage can be avoided.

In one preferred embodiment, the current-dependent portion $U\_ohm$ of the measured voltage $U\_measured$ is ascertained by evaluating the current and nonreactive resistances inside and/or outside the at least one electrical storage unit, particularly inside and/or outside electrochemical cells in the at least one electrical storage unit. In this context, it is found to be advantageous if particularly the nonreactive resistance of electrochemical cells, measuring lines and/or contact points is sensed and is taken into account when the current-dependent portion $U\_ohm$ of the voltage is eliminated.

It is found to be advantageous if the nonreactive resistance is ascertained before and/or during the monitoring. By way of example, this can be accomplished by ascertaining the nonreactive resistances of at least some of the components of the at least one electrical storage unit and the monitoring unit, such as electrochemical cells, measuring lines and/or contact points, in advance by means of tests. In one preferred embodiment, provision is also made for the nonreactive resistances of at least some of the components (also) to be ascertained during the runtime, for example by means of calibration. From the ascertained nonreactive resistances and the measured current values, it is then possible to determine the current-dependent portion U_ohm of the measured voltage U-measured. Moreover, ascertainment during the monitoring provides the advantage that the (varying) resistance values sensed by calibration can be taken as a basis for (variably) customizing voltage thresholds for the identification of overvoltage and/or undervoltage.

In a further preferred embodiment, an overvoltage and/or undervoltage is identified purely on a software basis. For this, the parameters sensed by sensors are evaluated by a computer program. By way of example, the sensors may be voltage, current and temperature sensors for sensing the values of the relevant parameters. The monitoring algorithms are implemented on a data processing device. The data processing device may be a microcontroller, a programmable chip, a programmable processor, a programmable logic unit or the like; in general terms, a programmable data processing device on which the monitoring functions are implemented by software (computer programs). The software-based monitoring has the particular advantage that it also allows a nonreactive resistance to be taken into account that varies over the lifespan of the electrical storage unit on account of cell ageing. Effects such as corrosion or deteriorating contact-connections on measuring lines or at contact points can be quantified only by means of software diagnosis.

In a further preferred embodiment, idle voltage U_OCV is calculated directly or is ascertained from a family of characteristic curves. The families of characteristic curves are preferably stored in the data processing device. The direct calculation evaluates the relationship $$U\_OCV = U\_\text{measured} + U\_ohm,$$

in which U_measured is known from the measurement and U_ohm is known from the advanced determination and/or calibration during the runtime. When the idle voltage U_OCV is determined using families of characteristic curves, it is found to be advantageous if further parameters, such as temperature, are taken into account. Preferably, temperature-dependent families of characteristic curves are used.

An arrangement for monitoring the voltage on at least one electrical storage unit according to the disclosure has not only the at least one electrical storage unit but also at least one data processing device, such as a microcontroller, a chip and/or processor, and is set up such that a method for monitoring the voltage on the at least one electrical storage unit can be carried out, with the idle voltage U_OCV on the at least one electrical storage unit being extracted from a voltage U_measured that is measured on the at least one electrical storage unit.

By way of example, the at least one electrical storage unit may be a battery, preferably a traction battery in an electric or hybrid vehicle. In one preferred embodiment, the electrical storage unit comprises at least one electrochemical cell, but preferably a multiplicity of electrochemical cells. In this case, a plurality of, that is to say at least two, electrochemical cells may in turn be combined to form an electrochemical module.

A further aspect of the disclosure relates to a battery having an arrangement for monitoring the voltage on the battery, wherein the arrangement is set up such that a method for monitoring the voltage on the at least one electrical storage unit can be carried out, with the idle voltage U_OCV on the at least one electrical storage unit being extracted from a voltage U_measured that is measured on the at least one electrical storage unit. Preferably, the battery is a lithium ion battery or the battery comprises electrochemical cells which are in the form of lithium ion battery cells.

Another aspect of the disclosure relates to a motor vehicle having an electric drive motor for driving the motor vehicle and a battery that is connected or can be connected to the electric drive motor, according to the aspect of the disclosure that is described in the preceding paragraph.

However, the battery is not restricted to such a purpose but may also be used in other electrical systems.

The disclosure therefore provides purely software-based monitoring of cell voltages. The monitoring at least also takes account of the current and the nonreactive resistances as influencing variables for the voltage measurement and for the exceeding of voltage limit values.

A further advantage of the disclosure is that taking account of the nonreactive contribution of the resistances inside and outside the electrochemical cell variably customizes the voltage thresholds, with the result that 1) an overvoltage in the electrochemical cells at high currents is identified better and 2) erroneous identification of undervoltage at high currents can be prevented. In particular, item 2) allows better utilization of the cell capacity.

Advantageous developments of the disclosure are described in the description.

BRIEF DESCRIPTION OF THE DRAWINGS

Exemplary embodiments of the disclosure are explained in more detail with reference to the description which follows and the drawing, in which:

The FIGURE shows an exemplary battery module having six battery cells and a measuring unit.

DETAILED DESCRIPTION

The FIGURE shows an exemplary battery module 102 having six battery cells 104 and a measuring unit 106. The cells 104, the measuring lines 108 and the contact points 110 contribute to the total nonreactive resistance of the system.

The measuring unit 106 measures the voltage $U_i$ (i=1, 2, ... ,6) of every single battery cell 104 and determines the module voltage $U_\Sigma$ therefrom. The measured voltages $U_i$ (i=1,2, ... ,6) of the battery cells 104 each contain the idle voltage Ui_OCV and the current-dependent portion Ui_ohm (I, R), which is dependent on the current I and the nonreactive resistance R of the battery cell 104_i, the contact points 110 and the measuring lines 108 between the battery cell 104_i and the measuring unit 106 (i=1,2, ... ,6).

On the basis of the formula $$Ui\_OCV = U_I + Ui\_ohm\ (I,R),$$

Ui_OCV can be calculated for any battery cell 104 directly or from a family of characteristic curves. It is found to be advantageous if further parameters, such as the temperature or the like, are taken into account.

The module voltage $U_\Sigma$ is then ascertained from the idle voltages Ui_OCV (i=1,2, ... ,6). Alternatively, provision can be made for the module voltage $U_\Sigma$ to be calculated from the measured voltages $U_i$ and then for the idle voltage U_OCV of the module to be extracted from the module voltage $U_\Sigma$.

Since the current is likewise a safety-relevant variable, it is determined with a high level of reliability or would be determined with a high level of reliability in order to implement the disclosure. The same applies to further parameters that are taken into account when the method according to the disclosure is extended to other influencing variables, such as temperature.

The nonreactive resistance R can either be determined in advance by tests (fixed) or during the runtime by calibration (variable). In this case, it is found to be advantageous if a minimum value is used for R in the case of advance determination of R.

For determination during the runtime, one preferred embodiment provides for the influence of the nonreactive resistance to be determined by a series of voltage measurements at currents of different levels.

In a further preferred embodiment, algorithms for determining the nonreactive resistance in the actual regulator are known.

The embodiment of the disclosure is not limited to the preferred exemplary embodiments indicated above. Instead, a number of variants are conceivable that make use of the method according to the disclosure, the arrangement according to the disclosure, the battery according to the disclosure and the motor vehicle according to the disclosure even in the case of embodiments of fundamentally different type.

What is claimed is:

1. A method for monitoring a voltage on at least one electrical storage unit, comprising:
    measuring a measured voltage on the at least one electrical storage unit;
    determining an open circuit voltage of the at least one electrical storage unit based on the measured voltage by eliminating a current-dependent portion of the measured voltage; and
    determining, based on the open circuit voltage, at least one of (i) an overvoltage of the at least one electrical storage unit and (ii) an undervoltage of the at least one electrical storage unit.

2. The method according to claim 1, further comprising:
    ascertaining the current-dependent portion by evaluating nonreactive resistances.

3. The method according to claim 2, further comprising:
    ascertaining the nonreactive resistances at least one of before the monitoring and during the monitoring.

4. The method according to claim 1, the determining of the at least one of the overvoltage and the undervoltage further comprising:
    determining the overvoltage and the undervoltage based on a comparison of the open circuit voltage with at least one threshold.

5. The method according to claim 1, further comprising:
    one of (i) calculating the idle voltage directly, and (ii) ascertaining the idle voltage from a family of characteristic curves.

6. The method according to claim 1, wherein the monitoring involves not only the measured voltage but also at least the temperature being sensed and evaluated.

7. The method according to claim 1, wherein the measuring and determining are performed by an arrangement that includes at least one data processing device.

8. A battery comprising:
    at least one electrical storage unit; and
    an arrangement including at least one data processing device, the arrangement being configured to monitor a voltage on the at least one electrical storage unit by (i) measuring a measured voltage on the at least one electrical storage unit, (ii) determining an open circuit voltage of the at least one electrical storage unit based on the measured voltage by eliminating a current-dependent portion of the measured voltage, and (iii) determine, based on the open circuit voltage, at least one of (i) an overvoltage of the at least one electrical storage unit and (ii) an undervoltage of the at least one electrical storage unit.

9. A motor vehicle comprising:
    an electric drive motor configured to drive the motor vehicle; and
    a battery configured to be connected to the electric drive motor and including (i) at least one electrical storage unit, and (ii) an arrangement including at least one data processing device, the arrangement being configured to monitor a voltage on the at least one electrical storage unit by (i) measuring a measured voltage on the at least one electrical storage unit, (ii) determining an open circuit voltage of the at least one electrical storage unit based on the measured voltage by eliminating a current-dependent portion of the measured voltage, and (iii) determine, based on the open circuit voltage, at least one of (i) an overvoltage of the at least one electrical storage unit and (ii) an undervoltage of the at least one electrical storage unit.

* * * * *